(12) United States Patent
Minzoni

(10) Patent No.: US 7,429,879 B2
(45) Date of Patent: Sep. 30, 2008

(54) CLOCK RECEIVER CIRCUIT DEVICE, IN PARTICULAR FOR SEMI-CONDUCTOR COMPONENTS

(75) Inventor: Alessandro Minzoni, Xian (CN)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/574,236

(22) PCT Filed: Sep. 10, 2004

(86) PCT No.: PCT/EP2004/052126

§ 371 (c)(1),
(2), (4) Date: Jan. 18, 2007

(87) PCT Pub. No.: WO2005/034131

PCT Pub. Date: Apr. 14, 2005

(65) Prior Publication Data

US 2007/0117531 A1    May 24, 2007

(30) Foreign Application Priority Data

Sep. 30, 2003    (DE) .................................. 103 45 491

(51) Int. Cl.
*H03K 19/096* (2006.01)

(52) U.S. Cl. .............................. 326/96; 326/97; 326/98; 326/113

(58) Field of Classification Search .................. 326/86, 326/95–98, 127; 327/165, 171, 210–214, 327/256–259

See application file for complete search history.

(56) References Cited

U.S. PATENT DOCUMENTS

| | | | | |
|---|---|---|---|---|
| 5,852,378 A | * | 12/1998 | Keeth | .......................... 327/171 |
| 6,184,730 B1 | | 2/2001 | Kwong et al. | |
| 6,292,042 B1 | | 9/2001 | Kim et al. | |
| 6,301,322 B1 | * | 10/2001 | Manning | ...................... 377/54 |
| 2002/0140481 A1 | | 10/2002 | Tschanz et al. | |
| 2002/0175749 A1 | * | 11/2002 | Hedberg et al. | ................. 330/9 |

* cited by examiner

*Primary Examiner*—Anh Q Tran
(74) *Attorney, Agent, or Firm*—Dicke, Billing & Czaja, PLLC

(57) ABSTRACT

A semi-conductor component with a receiver, in particular a clock receiver circuit device, as well as a receiver, in particular a clock receiver circuit device is disclosed. The clock receiver circuit device includes a first input adapted to be connected with a first connection of a semi-conductor component, and second input adapted to be connected with a second connection of the semi-conductor component, wherein the receiver circuit device includes several, in particular more than three transfer gates.

17 Claims, 2 Drawing Sheets

CLOCK RECEIVER CIRCUIT DEVICE, IN PARTICULAR FOR SEMI-CONDUCTOR COMPONENTS

CROSS REFERENCE TO RELATED APPLICATION

This Utility Patent Application claims the benefit of the filing date of German Application No. DE 103 45 491.8, filed Sep. 30, 2003, and International Application No. PCT/EP2004/052126, filed Sep. 10, 2004, both of which are herein incorporated by reference.

FIELD OF THE INVENTION

The invention relates to a receiver, in particular a clock receiver circuit device, as well as a semi-conductor component with such a circuit device.

BACKGROUND

So-called clock signals are used in semi-conductor components, in particular in memory components such as DRAMs (DRAM=Dynamic Random Access Memory and/or Dynamic Read/Write Memory)—for instance based on CMOS technology—for the chronological co-ordination of the processing and/or relaying of data.

In conventional semi-conductor components a single clock signal (i.e. a so-called single-ended clock signal)—present on a single line—is generally applied.

The data can then for instance be relayed during the ascending clock flank of the single-ended clock signal (or alternatively for instance in each case during the descending single-ended clock flank).

In conventional technology in addition, so-called DDR components, in particular DDR-DRAMS (DDR-DRAM=Double Data Rate DRAMs and/or DRAMs with double data rate), are already known.

With DDR components two differential, conversely equal clock signals—present on two separate lines—are used instead of a single clock signal ("single-ended" clock signal) present on a single line.

Whenever for instance the first of the two clock signals changes its state from "high logic" (for instance from a high voltage level) to "low logic" (for instance to a low voltage level) the second clock signal—essentially simultaneously—changes its state from "low logic" to "high logic" (for instance from a low to a high voltage level).

Conversely, whenever for instance the first clock signal changes its state from "low logic" (for instance from a low voltage level) to "high logic" (for instance to a high voltage level) the second clock signal—again essentially simultaneously—changes its state from a "high logic" to "low logic" (for instance from a high to a low voltage level). In DDR components data is usually relayed during both the ascending flank of the first clock signal as well as during the ascending flank of the second clock signal (and/or during the descending flank of the first clock signal as well as during the descending flank of the second clock signal).

This has the effect that in a DDR component the relaying of data takes place more frequently and/or more quickly (in particular twice as frequently or twice as quickly) than with corresponding conventional components with a single and/or "single-ended" clock signal, i.e. the data rate is higher, in particular twice as high as that of corresponding conventional components.

DDR components comprise for instance two—external—clock connections at which corresponding differential clock signals clk, bclk—generated by an external clock generator—can be applied and relayed—directly—to corresponding inputs of a clock receiver circuit device.

Conventional clock receiver circuit devices for instance comprise four transistors, for instance a first and a second p-channel field effect transistor (for instance two p-channel MOSFETs) as well as a first and a second n-channel field effect transistor (for instance two n-channel MOSFETs).

The source of the first n-channel field effect transistor can be connected with a (DC or constant) current source—connected with the ground potential—via corresponding lines. In similar fashion the source of the second n-channel field effect transistor can be connected via corresponding lines with the (DC) current source—connected with the ground potential.

In addition, the gate of the first n-channel field effect transistor of the clock receiver circuit device can for instance be connected with the above (first) input of the circuit (at which for instance the above—first—clock signal clk is present) and the gate of the second n-channel field effect transistor for instance with the above (second) input of the circuit (at which for instance the above second clock signal bclk, inverted in relation to the first clock signal clk, is present).

The drain of the first n-channel field effect transistor can be connected with the gate of the first and second p-channel field effect transistor via a corresponding line, and with the drain of the first p-channel field effect transistor, as well as—via a corresponding line—with a (first) output of the clock receiver circuit (at which a (first) output signal bout can be detected).

In corresponding fashion the drain of the second p-channel field effect transistor can be connected with the drain of the second p-channel field effect transistor, as well as—via a corresponding further line—with a (second) output of the clock receiver circuit (at which a (second) output signal out can be detected).

The source of the first and second p-channel field effect transistor can in each case be connected with the corresponding supply voltage vddq.

The first output signal bout emitted by the clock receiver circuit device corresponds with the signal bclk present at the (second) input of the clock receiver circuit device, and the second output signal out, emitted by the clock receiver circuit device, with the signal clk present at the (first) input of the clock receiver circuit device (whereby—depending on the nature of the change of the input signals clk and/or bclk (for instance from "high logic" to "low logic", or vice versa)—the delay periods caused by the clock receiver circuit device can differ relatively strongly).

The output signals out, bout emitted by the clock receiver circuit device can be relayed to further circuits provided in the semi-conductor component, where they can for instance be used for the chronological co-ordination of the processing and/or relaying of data, i.e. as differential clock signals out, bout.

SUMMARY

The present invention provides a novel receiver, in particular a clock receiver circuit device, as well as a semi-conductor component with such a circuit device.

In one embodiment of the invention a receiver, in particular a clock receiver circuit device is made available, with a first input adapted to be connected with a first connection of a semi-conductor component, and a second input adapted to be connected with a second connection of the semi-conductor component, the receiver circuit device includes several, in particular more than three, for instance four transfer gates.

Particularly advantageously transfer gates connected with one and the same output line are in each case controlled by differing, complementary input signals—present at the above inputs.

In this way it is achieved that each time a corresponding first transfer gate is switched "on", a complementary second transfer gate allocated to this transfer gate—connected with the same output line—is switched "off", (and vice versa), and correspondingly, that whenever a corresponding third transfer gate is switched "off", a complementary fourth transfer gate allocated to this transfer gate—connected with the same output line—is switched "on" (and vice versa).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Below the invention is more closely described by means of an embodiment example and the attached illustration. In the illustration.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
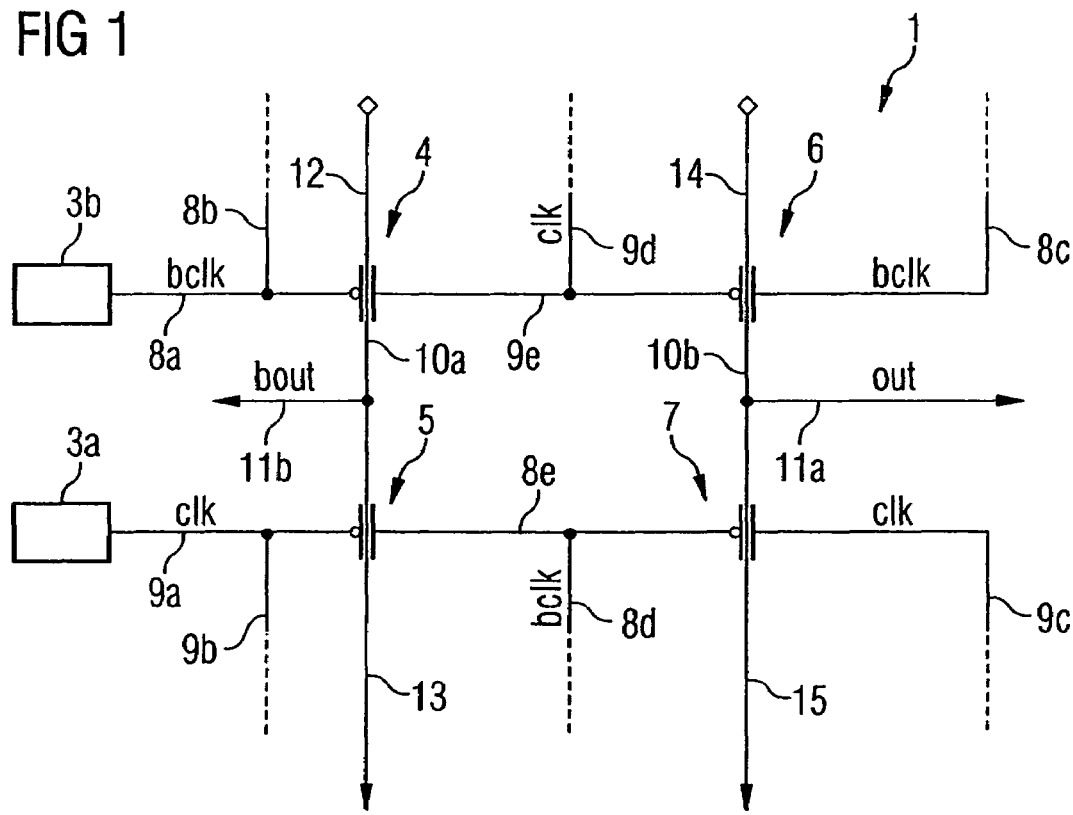
FIG. 1 illustrates a schematic representation of a receiver, in particular a clock receiver circuit device in terms of an embodiment example of the present invention.

In FIG. 1 a schematic representation of a receiver, in particular a clock receiver circuit device in terms of an embodiment example of the present invention is shown.

The circuit device can for instance be installed into a semiconductor component, for instance into a DRAM memory component (DRAM=Dynamic Random Access Memory and/or dynamic read/write memory) based on CMOS technology.

The DRAM memory component can for instance be a DDR DRAM (DDR DRAM=double data rate DRAM).

This component comprises two input clock connections 3a, 3b (for instance corresponding component pads connected with corresponding pins), whereby a first clock signal—generated by an external clock signal generator, i.e. of external origin—is applied to the first clock connection 3a, and a second clock signal bclk—similarly generated by the external clock signal generator—is applied to the second clock connection 3b.

Figure 2:
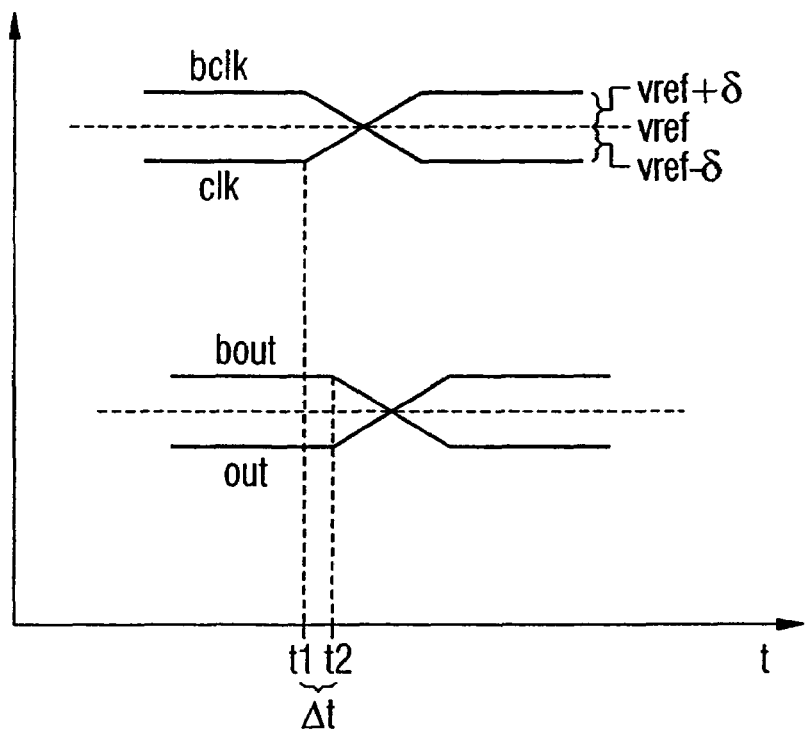
FIG. 2 illustrates a schematic representation of the chronological course of the input signals (clk; bclk) present at the clock receiver circuit device in terms of FIG. 1, and of the signals (out; bout) emitted by the clock receiver circuit device.

The two clock signals clk and bclk may—as is for instance shown in FIG. 2—be differential, i.e. inversely equal clock signals; for instance whenever the first clock signal clk changes from a "high logic" to a "low logic" state, the second clock signal bclk—essentially simultaneously—changes its state from "low logic" to "high logic".

Conversely, whenever the first clock signal clk changes its state from "low logic" to "high logic" (in FIG. 2 for instance at point t1) the second clock signal—essentially simultaneously (i.e. in FIG. 2 for instance—also—at point t1)—changes its state from "high logic" to "low logic".

The above double data rate (in contrast to conventional components using only a single (single-ended) clock signal CLK) is achieved in the DDR component by respective data for instance not only being relayed during the ascending (or alternatively descending) clock flank of a single (single-ended) clock signal, but during the ascending flank of the first clock signal clk, as well as during the ascending flank of the second clock signal bclk (and/or both during the descending flank of the first clock signal clk as well as during the descending flank of the second clock signal bclk)(and/or during corresponding flanks of signals out, bout, and/or out', bout' (see below) derived from them)), i.e. twice as frequently than with conventional components with a single (single-ended) clock signal CLK.

As shown in FIG. 1, the clock receiver circuit device 1 comprises four transfer gates and/or transmission gates 4, 5, 6, 7.

Each transfer gate 4, 5, 6, 7 in each case comprises—corresponding with conventional transfer gates—a (first) control input and a (second, inverse) control input.

The transfer gates 4, 5, 6, 7 can for instance—corresponding with conventional transfer gates—each comprise an n- and a p-channel MOSFET, whereby the gate of the n-channel MOSFET can for instance be connected with the first control input of each respective transfer gate 4, 5, 6, 7 and the gate of the p-channel MOSFET for instance with the second (inverse) control input of the respective transfer gates 4, 5, 6, 7 (or vice versa).

With the transfer gates 4, 5, 6, 7 in addition—corresponding with conventional transfer gates—the sources of the p- and of n-channel MOSFETs are in each case for instance connected with each other and with a corresponding (first) transfer gate connection, and—correspondingly—for instance the drain of the n- and the drain of the p-channel MOSFETS are connected with each other and with a corresponding (second) transfer gate connection (or vice versa).

As is apparent from FIG. 1, in the clock receiver circuit device 1, the clock connection 3a—where, as described above, the clock signal clk is present—is connected via a line 9a with the second (inverted) control input of the transfer gate 5 (the above—first—clock signal clk is thereby led to the second inverted control input of the transfer gate 5).

The line 9a is connected with via a line 9b connected with it, with a line 9c, which is connected with the first (non-inverted) control input of the transfer gate 7 (the above—first—clock signal clk is thereby—also—fed to the first non-inverted control input of transfer gate 7).

As is further apparent from FIG. 1, in the clock receiver circuit device 1, the clock connection 3b—where, as described above, the second, inverted clock signal bclk is present—is connected with the second (inverted) control input of transfer gate 4 via line 8a (the above second clock signal bclk is thereby fed to the—second—inverted control input of the transfer gate 4).

Line 8a is connected, via a line 8b connected with it, with a line 8c, which is connected with the first non-inverted control input of transfer gate 6 (whereby the above second inverted clock signal bclk is—also—fed to the non-inverted control input of transfer gate 6).

In addition the line 8a—at which as described above, the second inverted clock signal bclk is present—is connected, via a line 8b connected with line 8a, with a line 8d, which is connected with a further line 8e, which is connected with the first (non-inverted) control input of transfer gate 5, and with the second, inverted control input of transfer gate 7 (the above second, inverted clock signal bclk is thereby—also—fed to the first, non-inverted control input of transfer gate 5, and to the second, inverted control input of transfer gate 7).

As is further shown in FIG. 1, the line 9a—where, as described above, the first clock signal clk is present—is connected via a line 9b connected with it, with a line 9d, which is connected with a further line 9e, which is connected with the second (inverted) control input of transfer gate 6 and with the first, non-inverted control input of transfer gate 4 (the above first clock signal clk is thereby—also—fed to the second, inverted control input of transfer gate 6 and to the first non-inverted control input of transfer gate 4).

In terms of FIG. 1 the first (or the second) transfer gate connection of the transfer gate 4 is in each case connected—via a line 10a—with the—inverted—second (or first) transfer gate connection of transfer gate 5.

Correspondingly the first (or second) transfer gate connection of the transfer gate 6 is in each case connected—via a line 10b—with the—inverted—second (or first) transfer gate connection of transfer gate 7.

Line 10b, at which the corresponding signal, emitted at the corresponding transfer gate connections of the transfer gates 6, 7 can be detected, is connected with an output line 11a, at which the first output signal of the clock receiver circuit device (first output signal out), corresponding with the first clock signal clk—as shown in FIG. 2 described in more detail below—can be detected.

In corresponding fashion, line 10a, at which the corresponding signal emitted at the corresponding transfer gate connections of the transfer gates 4, 5 can be detected, is connected with a (further) output line 11b, at which the second output signal of the clock receiver circuit device (second output signal bout) corresponding with the second clock signal bclk—shown in FIG. 2 and described in more detail below—can be detected.

As is further shown in FIG. 1, the further (second (or first)) transfer gate connection of transfer gate 4 is connected—via a line 12—with the supply voltage vddq (which can for instance amount to between 2.5 V and 3.5 V, in particular for instance 2.5 V or 2.9 V).

In addition the further—inverted—(first (or second)) transfer gate connection of transfer gate 5 is connected with ground potential.

Correspondingly similar to transfer gate 4, the further (second (or first)) transfer gate connection of transfer gate 6 is connected—via line 14—with the above supply voltage vddq.

In addition—correspondingly similar to transfer gate 5—at transfer gate 7 the further—inverted—(first (or second)) transfer gate connection is also connected with ground potential.

The voltage level of the first and second output signals out, bout (in each case in a "high logic" state) can for instance amount to half the voltage level of the above supply voltage vddq, for instance between 1.25 V and 1.75 V, in particular for instance 1.25 V or 1.45 V.

If for instance as is shown in FIG. 2 during a first clock phase, i.e., here till a point t1 (and especially in the above alternative) a "low logic" first clock signal clk is present at the first clock connection 3a (and thereby also—via line 9c—at the first, non-inverted control input of transfer gate 7,—via line 9e—at the first, non-inverted control input of transfer gate 6,—via line 9e—at the second inverted control input of transfer gate 4, and—via line 9a—at the second inverted control input of the transfer gate 5 a corresponding "low logic" signal), and if—during the same clock phase—a "high logic" second clock signal bclk is present at the second clock connection 3b (and thereby also—via line 8e—at the second, inverted control input of transfer gate 7,—via line 8c—at the second, inverted control input of transfer gate 6,—via line 8a—at the first, non-inverted control input of transfer gate 4, and—via line 8e—at the first non-inverted control input of transfer gate 5 a corresponding "high logic" signal), the transfer gate 4 is switched off (i.e. both the connections of transfer gate 4—connected with line 12 and/or 10a—are—relatively highly resistively—electrically disconnected from each other), transfer gate 5 is switched on and/or through (i.e. both the transfer gate connections of transfer gate 5—connected with line 10a and/or 13—are—at a relatively low level of resistivity—electrically connected with each other), transfer gate 7 is switched off (i.e. both the connections of transfer gate 7—connected with line 10b and/or 15—are—relatively highly resistively—disconnected from each other), and transfer gate 6 is switched on and/or through (i.e. both the transfer gate connections of transfer gate 6—connected with line 14 and/or 10b—are—at a relatively low level of resistivity—electrically connected with each other).

The output line 11b of the clock receiver circuit device 1 is thereby—at a relatively low level of resistivity—electrically connected with the ground potential present at line 13 and—relatively highly resistively—electrically disconnected from line 12, which is connected with the supply voltage vddq; the clock signal bout emitted onto output line 11b is thereby—corresponding with the second input signal bclk and as shown in FIG. 2—"high logic".

In addition, the output line 11a of the clock receiver circuit device 1 is—at a relatively low level of resistivity—electrically connected with the supply voltage vddq present on line 14, and—relatively highly resistively—electrically disconnected from line 15, which is connected with the ground potential; the clock signal out emitted onto output line 11a is thereby—corresponding with the first input signal clk and as shown in FIG. 2—"low logic".

If—as illustrated in FIG. 2, for instance at the start of a second clock phase following on the first clock phase, i.e. here at a point t1 (and particularly in the above alternative)—the first clock signal clk present at the first clock signal connection 3a changes its state to "high logic" (and the corresponding signal present at the first, non-inverted control input of transfer gate 7, at the first, non-inverted control input of transfer gate 6, at the second, inverted control input of transfer gate 4, at the second, inverted control input of transfer gate 5 changes its state to "high logic"), and if the second clock signal bclk present at the second clock connection 3b, changes its state—essentially simultaneously (here: at point t1)—to "low logic" (and thereby the corresponding signal present at the second, inverted control of transfer gate 7, at the second, inverted control input of transfer gate 6, at the first non-inverted control input of transfer gate 4 and at the first, non-inverted control input of transfer gate 5 also changes its state to "low logic" logic") transfer gate 4 is switched on and/or through (i.e. both transfer gate connections of transfer gate 4—connected with line 10a and/or 13—are—at relatively low resistivity—electrically connected with each other), transfer gate 5 is switched off (i.e. both transfer gate connections of transfer gate 5—connected with line 10a and/or 13—are—relatively highly resistively—electrically disconnected), transfer gate 7 is switched on and/or through (i.e. both transfer gate connections of transfer gate 6—connected with line 10b and/or 15—are electrically connected—at a relatively low level of resistivity—with each other), and transfer gate 6 is switched off (i.e. both transfer gate connections of transfer gate 6—connected with line 14 and/or 10b are—relatively highly resistively—electrically disconnected from each other).

The output line 11b of the clock receiver circuit device 1 is thereby—relatively highly resistively—electrically disconnected from the ground potential present at line 13, and—at relatively low resistivity—electrically connected with line 12, which is connected with the supply voltage vddq; the clock signal bout emitted onto output line 11b thereby—corresponding with the second input clock signal bclk, and as shown in FIG. 2, having had a particular switching delay period $\Delta t$ imposed on it in relation to the clock signal bclk, at a point t2—changes its state to "low logic".

In addition the output line 11a of the clock receiver circuit device 1 is thereby—at relatively high resistivity—electrically disconnected from the supply voltage vddq present at line 14, and—at relatively low resistivity—electrically connected with line 15, which is connected with the ground potential; the clock signal out emitted onto output line 11a thereby—corresponding with the first input clock signal clk, and as shown in FIG. 2, having had a particular switching delay period $\Delta t$ (which essentially corresponds with the above switching delay period $\Delta t$ of the clock signal bout) imposed in relation to the clock signal clk, at a point t2 (i.e. at essentially the same point t2 as clock signal bout)—changes its state to "high logic".

The output signals (differential clock signals out, bout) derived from the input clock signals clk, bclk emitted onto output lines 11a, 11b, can then be relayed to further circuits provided in the semi-conductor component, and there for instance be used for the chronological co-ordination of the processing and/or relaying of data.

In the (clock) receiver circuit device 1 shown in FIG. 1, use is made of the fact that each of the transfer gates 4, 5, 6, 7,—between corresponding transfer gate connections—comprises a variably adjustable ohmic resistance, with a resistivity value that depends on the control signals present at the respective control inputs.

Figure 3:
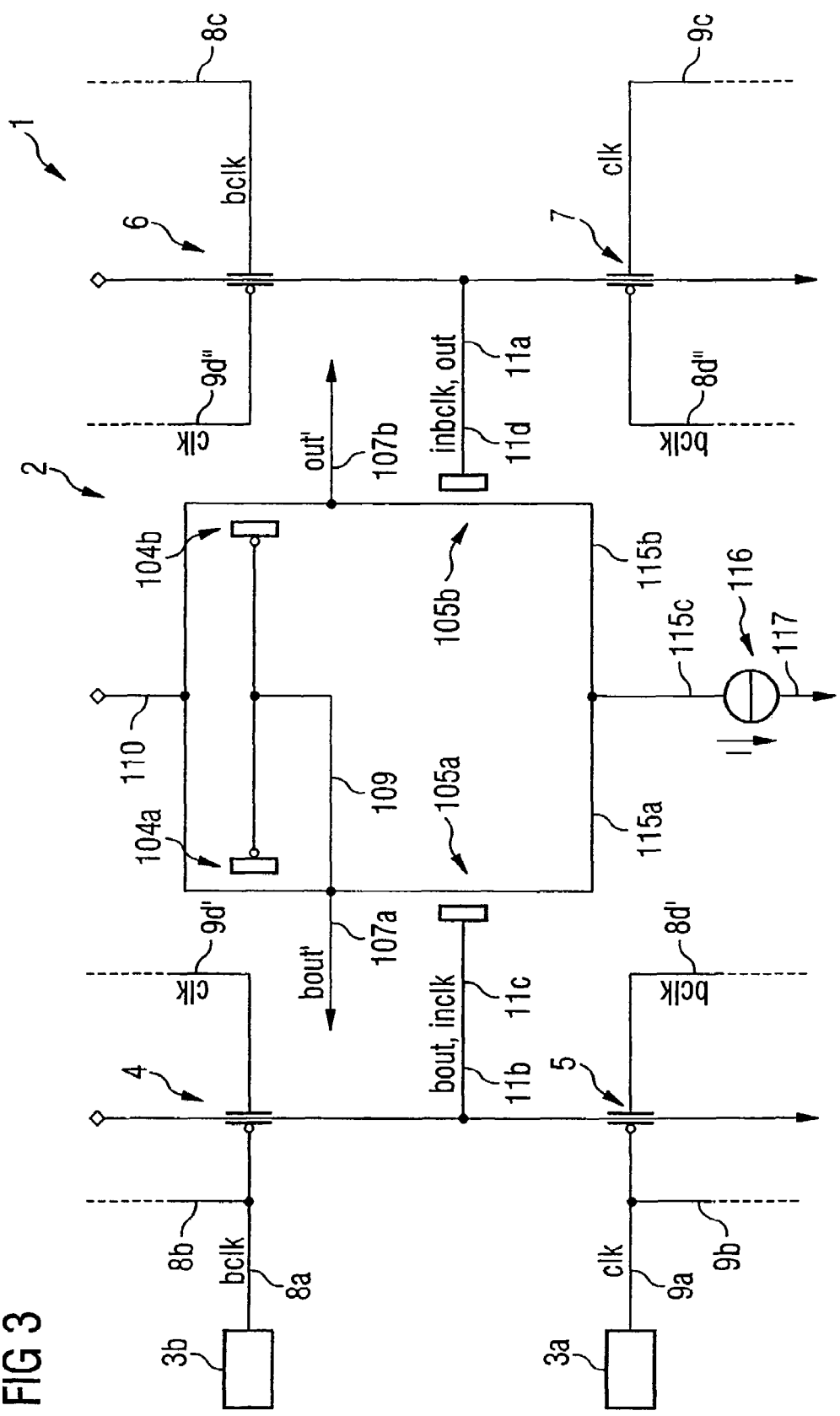
FIG. 3 illustrates a schematic representation of a receiver, in particular a clock receiver circuit device in terms of a further embodiment example of the present invention.

In an alternative embodiment example of the invention, shown in FIG. 3, the output signals (differential clock signals out, bout) emitted onto the output lines 11a, 11b and derived from the input clock signals clk, bclk, can—in a clock receiver circuit device 1, correspondingly similarly constructed with the clock receiver circuit device shown in FIG. 1—be used to "boost" a circuit 2, which has been similarly constructed to conventional receiver, especially clock receiver circuit devices.

As is apparent from FIG. 3, the clock receiver circuit device 1 shown there has been identically constructed to the clock receiver circuit device 1 shown in FIG. 1, except that the first clock signal clk, present at the first clock connection 3a of the corresponding semi-conductor component, is led to the second, inverted control input of transfer gate 6 and the first, non-inverted control input of transfer gate 4 not via the lines 9d, 9e shown in FIG. 1, but rather—to the control input of the transfer gate 4—via a separate line 9d'—for instance also connected with line 9b—and—to the control input of the transfer gate 6—via a separate line 9d"—for instance also connected with line 9b—, and that the second clock signal bclk, present at the second clock connection 3b of the corresponding semi-conductor component, is led to the first, non-inverted control input of transfer gate 5, and to the second inverted control input of transfer gate 7 not via lines 8d, 8e shown in FIG. 1, but rather—to the control input of transfer gate 5—via a separate line 8d'—for instance connected with line 8b—and—to the control input of transfer gate 7—via a separate line 8d"—for instance also connected with the line 8b.

In addition—corresponding with the embodiment example shown in FIG. 1—with the clock receiver circuit device 1 according to FIG. 3, the first clock signal clk present at the first clock connection 3a, is (additionally) led to the second, inverted control input of the transfer gate 5 (in fact via line 9a), and (in fact via line 9a, and the lines 9b, 9c connected with it) to the first non-inverted control input of the transfer gate 7.

Furthermore—also corresponding with the embodiment example shown in FIG. 1—with the clock receiver circuit device 1 according to FIG. 3, the second clock signal bclk present at the second clock connection 3b, is (additionally also) led to the second, inverted control input of transfer gate 4 (in fact via line 8a), and (in fact via line 8a, and the lines 8a, 8c connected with it) to the first non-inverted control input of transfer gate 6.

As is apparent from FIG. 3, the circuit 2 has been similarly constructed to the conventional clock receiver circuits, except that the inputs 11c, 11d of circuit 2 are not—as is commonly done—directly connected with the corresponding clock connections 3a, 3b of the semi-conductor component (for instance input 11c with the clock connection 3b (or 3a), and input 11d with clock connection 3a (or 3b)), but rather input 11c with the output line 11b of the clock receiver circuit device 1 (onto which, as described above, the (clock) signal bout, corresponding with the input clock signal bclk, is emitted by the clock receiver circuit device 1) and input 11d with output line 11a of the clock receiver circuit device 1 (onto which, as described above, the (clock) signal out, corresponding with the input clock signal clk is emitted by the clock receiver circuit device 1).

The circuit 2 comprises—correspondingly similar with conventional clock receiver circuit devices—four transistors 104a, 104b, 105a, 105b, and in fact a first and a second p-channel field effect transistor 104a, 104b (here: two p-channel MOSFETs) as well as a first and a second n-channel field effect transistor 105a, 105b (here: two n-channel MOSFETs 105a, 105b).

The source of the first n-channel field effect transistor 15a is connected via a line 115a and a line 115c with a (DC and/or constant) current source 116, which is connected—via a line 117—with the ground potential. In corresponding fashion the source of the n-channel field effect transistor 105b is also connected with the (DC and/or constant) current source 116—connected with ground potential—via a line 115*b* and the above line 115*c*.

In addition the gate of the first n-channel field effect transistor 105*e* is connected with the above (first) input 11*c* of circuit 2 and the gate of the second n-channel field effect transistor 105*b* with the above (second) input 11*d* of circuit 2.

The drain of the first n-channel field effect transistor 105*a* is connected with the gate of the first and second p-channel field effect transistors 104*a*, 104*b* via a line 109, and with the drain of the first p-channel field effect transistor 104*a* as well as—via a line 107*a*—with a (first) output of circuit 2 (at which a (first) output signal bout' can be detected).

In corresponding fashion the drain of the second n-channel field effect transistor 105*b* is connected with the drain of the second p-channel field effect transistor 104*a*, as well as—via a line 107*b*—with a (second) output of circuit 2 (at which a (second) output signal out' can be detected).

The source of the first and second p-channel field effect transistors 104*a*, 104*b* is—via a line 110—in each case connected with the above supply voltage vddq.

The first output signal bout'—emitted onto line 107*a*—of the circuit 2 corresponds with the signal out (and/or the signal bout) present at input 11*d* of circuit 2 and/or with the signal clk present at clock connection 3*a* (and/or the signal bclk present at clock connection 3*b*).

The second output signal out'—emitted onto line 107*b*—of circuit 2, corresponds with the signal bout present at input 11*c* of circuit 2 (and/or the signal out) and/or the signal bclk present at the clock connection 3*b* (and/or the signal clk present at the clock connection 3*a*).

The output signals out', bout', derived from the input clock signals clk, bclk and emitted onto lines 107*a*, 107*b*, can be relayed to further circuits provided in the semi-conductor component and used there for the chronological coordination of the processing and/or relaying of data, i.e. as differential clock signals out', bout'.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A clock receiver circuit device comprising:
a first input adapted to be connected with a first connection of a semi-conductor component to receive a first clock signal;
a second input adapted to be connected with a second connection of the semi-conductor component to receive a second clock signal inversely equal to the first clock signal; and
a receiver circuit comprising more than three transfer gates, the receiver circuit converting the first clock signal and the second clock signal into respective inversely equal clock output signals having voltage levels different from voltage levels associated with the received first and second clock signals.

2. The receiver circuit device according to claim 1, which comprises four transfer gates.

3. The receiver circuit device according to claim 1, comprising wherein at a first transfer gate a corresponding first transfer gate control input is connected with the second input of the receiver circuit device, and a corresponding second transfer gate control input, inverse in relation to the first transfer gate control input, is connected with the first input of the receiver circuit device.

4. The receiver circuit device according to claim 3, comprising wherein at a first transfer gate a corresponding first transfer gate control input is connected with the second input of the receiver circuit device, and a corresponding second transfer gate control input, inverse in relation to the first transfer gate control input, is connected with the first input of the receiver circuit device.

5. The receiver circuit device according to claim 4, comprising wherein at a second transfer gate connected with the first transfer gate, a corresponding first transfer gate control input is connected with the first input of the receiver circuit device, and a corresponding second transfer gate control input, inverse in relation to the first transfer gate control input is connected with the second input of the receiver circuit device.

6. The receiver circuit device according to claim 1, comprising wherein at a third transfer gate a corresponding first transfer gate control input is connected with the first input of the receiver circuit device, and a corresponding second transfer gate control input, inverse in relation to the first transfer gate control input is connected with the second input of the receiver circuit device.

7. The receiver circuit device according to claim 6, comprising wherein at a fourth transfer gate connected with third transfer gate, a corresponding first transfer gate control input is connected with the second input of the receiver circuit device, and a corresponding second transfer gate control input, inverse in relation to the first transfer gate control input, is connected with first input of the receiver circuit device.

8. The receiver circuit device according to claim 1, in which differential clock signals are present at the first and second inputs.

9. A clock receiver circuit device comprising:
a first input adapted to be connected with a first connection of a semi-conductor component to receive a first clock signal;
a second input adapted to be connected with a second connection of the semi-conductor component to receive a second clock signal inversely equal to the first clock signal;
a receiver circuit converting the first clock signal and the second clock signal into respective inversely equal clock output signals having voltage levels different from voltage levels associated with the received first and second clock signals;
a first transfer gate and a third transfer gate, each of the first transfer gate and the third transfer gate having a corresponding first transfer gate control connection is connected with the second clock input of the clock receiver circuit device, and a corresponding second transfer gate control connection, inverse in relation to the first transfer gate control connection, connected with the first clock input of the clock receiver circuit device; and
a second transfer gate and a fourth transfer gate, each of the second transfer gate and the fourth transfer gate having a corresponding first transfer gate control connection connected with the first clock input of the clock receiver circuit device, and a corresponding second transfer gate control connection, inverse in relation to the first transfer gate control connection, connected with the second clock input of the clock receiver circuit device, wherein corresponding further connections of the transfer gates are connected to apply a first voltage to a further connection of both the first transfer gate and the fourth transfer gate, and a second voltage, different from the first voltage, to a further connection of both the second transfer gate and the third transfer gate.

10. A clock receiver circuit device comprising:
a first clock input for receiving a first clock signal;
a second clock input for receiving a second clock signal, inversely equal to the first clock signal;
wherein at a first transfer gate a corresponding first transfer gate control connection is connected with the second clock input of the clock receiver circuit device, and a corresponding second transfer gate control connection, inverse in relation to the first transfer gate control connection, with the first clock input of the clock receiver circuit device; and
wherein at a second transfer gate a corresponding first transfer gate control connection is connected with the first clock input of the clock receiver circuit device, and a corresponding second transfer gate control connection, inverse in relation to the first transfer gate control connection, with the second clock input of the clock receiver circuit device,
wherein corresponding further connections of the transfer gates are connected with each other and are jointly connected with a clock output for emitting a clock output signal having a voltage level different from voltage levels associated with the received first and second clock signals.

11. A semi-conductor component having a receiver comprising:
a clock receiver circuit device comprising:
a first input adapted to be connected with a first connection of a semi-conductor component to receive a first clock signal;
a second input adapted to be connected with a second connection of the semi-conductor component to receive a second clock signal inversely equal to the first clock signal; and
a receiver circuit device comprises more than three transfer gates, the receiver circuit device converting the first clock signal and the second clock signal into respective clock output signals having voltage levels different from voltage levels associated with the received first and second clock signals.

12. The component according to claim 11, wherein the receiver device circuit comprises four transfer gates.

13. The component according to claim 11, comprising wherein at a first transfer gate a corresponding first transfer gate control input is connected with the second input of the receiver circuit device, and a corresponding second transfer gate control input, inverse in relation to the first transfer gate control input, is connected with the first input of the receiver circuit device.

14. The component according to claim 13, comprising wherein at a first transfer gate a corresponding first transfer gate control input is connected with the second input of the receiver circuit device, and a corresponding second transfer gate control input, inverse in relation to the first transfer gate control input, is connected with the first input of the receiver circuit device.

15. The component according to claim 14, comprising wherein at a second transfer gate connected with the first transfer gate, a corresponding first transfer gate control input is connected with the first input of the receiver circuit device, and a corresponding second transfer gate control input, inverse in relation to the first transfer gate control input is connected with the second input of the receiver circuit device;
wherein at a third transfer gate a corresponding first transfer gate control input is connected with the first input of the receiver circuit device, and a corresponding second transfer gate control input, inverse in relation to the first transfer gate control input is connected with the second input of the receiver circuit device; and
wherein at a fourth transfer gate connected with third transfer gate, a corresponding first transfer gate control input is connected with the second input of the receiver circuit device, and a corresponding second transfer gate control input, inverse in relation to the first transfer gate control input, is connected with first input of the receiver circuit device.

16. A clock receiver circuit device comprising:
a first clock input for receiving a first clock signal;
a second clock input for receiving a second clock signal, inversely equal to the first clock signal;
a first transfer gate and a third transfer gate, each of the first transfer gate and the third transfer gate having a corresponding first transfer gate control connection is connected with the second clock input of the clock receiver circuit device, and a corresponding second transfer gate control connection, inverse in relation to the first transfer gate control connection, connected with the first clock input of the clock receiver circuit device; and
a second transfer gate and a fourth transfer gate, each of the second transfer gate and the fourth transfer gate having a corresponding first transfer gate control connection connected with the first clock input of the clock receiver circuit device, and a corresponding second transfer gate control connection, inverse in relation to the first transfer gate control connection, connected with the second clock input of the clock receiver circuit device, wherein corresponding further connections of the transfer gates are connected to apply a first voltage to a further connection of both the first transfer gate and the fourth transfer gate, and a second voltage, different from the first voltage, to a further connection of both the second transfer gate and the third transfer gate.

17. A clock receiver circuit device comprising:
means for a first input adapted to be connected with a first connection of a semi-conductor component to receive a first clock signal;
means for a second input adapted to be connected with a second connection of the semi-conductor component to receive a second clock signal inversely equal to the first clock signal; and
means for converting the first clock signal and the second clock signal into respective inversely equal clock output signals having voltage levels different from voltage levels associated with the received first and second clock signals, wherein the receiver circuit device comprises more than three transfer gates.

* * * * *